United States Patent
Hshieh

(10) Patent No.: US 8,159,021 B2
(45) Date of Patent: Apr. 17, 2012

(54) TRENCH MOSFET WITH DOUBLE EPITAXIAL STRUCTURE

(75) Inventor: Fwu-Iuan Hshieh, Saratoga, CA (US)

(73) Assignee: Force-MOS Technology Corporation (TW)

( * ) Notice: Subject to any disclaimer, the term of this patent is extended or adjusted under 35 U.S.C. 154(b) by 533 days.

(21) Appl. No.: 12/070,853

(22) Filed: Feb. 20, 2008

(65) Prior Publication Data

US 2009/0206395 A1 Aug. 20, 2009

(51) Int. Cl.
*H01L 29/78* (2006.01)
*H01L 21/336* (2006.01)

(52) U.S. Cl. .................... 257/328; 438/270; 257/213

(58) Field of Classification Search .................. 257/213, 257/328, 340, E21.41, E29.201, E29.292
See application file for complete search history.

(56) References Cited

U.S. PATENT DOCUMENTS

| | | | | |
|---|---|---|---|---|
| 5,689,128 A * | 11/1997 | Hshieh et al. | ................. | 257/331 |
| 5,960,275 A * | 9/1999 | So et al. | ........................ | 438/211 |
| 6,262,453 B1 * | 7/2001 | Hshieh | ......................... | 257/341 |
| 6,518,127 B2 * | 2/2003 | Hshieh et al. | ................. | 438/270 |
| 6,674,124 B2 * | 1/2004 | Hshieh et al. | ................. | 257/330 |
| 6,707,127 B1 * | 3/2004 | Hshieh et al. | ................. | 257/483 |
| 6,833,584 B2 * | 12/2004 | Henninger et al. | .......... | 257/334 |
| 6,882,000 B2 * | 4/2005 | Darwish et al. | ............... | 257/307 |
| 6,921,697 B2 * | 7/2005 | Darwish et al. | ............... | 438/270 |
| 6,979,621 B2 * | 12/2005 | Hshieh et al. | ................. | 438/270 |
| 7,049,657 B2 * | 5/2006 | Matsuda | ....................... | 257/333 |
| 7,091,573 B2 * | 8/2006 | Hirler et al. | ................... | 257/500 |
| 7,235,842 B2 * | 6/2007 | Hueting et al. | ............... | 257/330 |
| 7,385,248 B2 * | 6/2008 | Herrick et al. | ................ | 257/330 |
| 7,494,876 B1 * | 2/2009 | Giles et al. | .................... | 438/270 |
| 7,557,409 B2 * | 7/2009 | Pattanayak et al. | .......... | 257/333 |
| 2002/0066926 A1 * | 6/2002 | Hshieh et al. | ................. | 257/330 |
| 2004/0188756 A1 * | 9/2004 | Matsuda | ...................... | 257/330 |
| 2007/0187753 A1 * | 8/2007 | Pattanayak et al. | .......... | 257/330 |

* cited by examiner

*Primary Examiner* — Ha Tran T Nguyen
*Assistant Examiner* — Jordan Klein
(74) *Attorney, Agent, or Firm* — Bo-In Lin

(57) ABSTRACT

A trenched semiconductor power device includes a plurality of trenched gates surrounded by source regions near a top surface of a semiconductor substrate encompassed in body regions. The trenched semiconductor power device further includes a first epitaxial layer above heavily doped substrate and beyond the trench bottom and a second epitaxial layer above said first epitaxial layer wherein a resistivity N1 of said first epitaxial layer is greater than a resistivity N2 of said second epitaxial layer represented by a functional relationship of N1>N2. In an exemplary embodiment, each of the trenched gates include an upper gate portion and lower gate portion formed with single polysilicon deposition processes wherein the lower gate portion is surrounded with a lower gate insulation layer having a greater thickness than an upper gate insulation layer surrounding the upper gate portion.

23 Claims, 12 Drawing Sheets

US 8,159,021 B2

TRENCH MOSFET WITH DOUBLE EPITAXIAL STRUCTURE

BACKGROUND OF THE INVENTION

1. Field of the Invention

The invention relates generally to the device configuration and manufacturing methods for fabricating the semiconductor power devices. More particularly, this invention relates to an improved and novel manufacturing process and device configuration for providing the MOSFET device with double epitaxial layers to improve the breakdown voltage while reducing the on-resistance of the semiconductor power device.

2. Description of the Related Art

In order to increase the switching speed of a semiconductor power device, it is desirable to reduce the electric charges between the gate and drain such that a reduction of a gate to drain capacitance Crss can be reduced. A thick oxide formed at the trench bottom of the trench gate is frequently implemented to reduce the gate to drain capacitance. However, a thicker oxide layer formed at the trench bottom may also cause further technical difficulties and limitations of device implementations. Since the epitaxial layer has a resistivity that is significantly dropped in order to satisfy a design target of further reducing the Rds, the device designers now confront another technical difficulty. With the reduction of the epitaxial resistivity, the device may not support the requirement that the breakdown voltage due to the fact that an early breakdown can occur at the trench bottom corners. A degradation of the breakdown voltage is therefore becoming a design and operation limitation.

Several patented inventions are implemented with thicker oxide layer in the bottom of the trenched gate in order to reduce the charges between the gate and the drain. FIG. 1A shows a trenched MOSFET device disclosed by Blanchard in U.S. Pat. No. 4,914,058. The trenched MOSFET device has a thicker gate oxide on the bottom and on the lower portion of the trench sidewalls. FIG. 1B shows a cross sectional view of another MOSFET device disclosed by U.S. Pat. Nos. 6,808,533, 6,833,584, and 6,720,616. The last trench on the right hand side is implemented as a field plate. However, as discussed above, when the resistivity of the epitaxial layer is decreased to provide a low Rds, the trench field plate may not support the breakdown voltage.

FIG. 1C is another cross sectional view of an alternate MOSFET device disclosed by U.S. Pat. No. 7,091,573 and Patent Publication 20070187753. A reduced Rds is achieved by reducing the epitaxial layer resistivity without degrading the breakdown voltage by applying a RESURF (Reduced Surface Electric Field) step oxide structure that has a reduced surface electric field with a thick oxide layer on the trench sidewall and the bottom surface of the trench. Additional disclosures of similar technologies are also published by M. A. Gajda et al "Industrialisation of Resurf Stepped Oxide Technology for power Transistors" (Proceedings of the 18$^{th}$ International Symposium on Power Semiconductor Device and ICs Jun. 4-8 2006 ISPD 2006) However, the trenched filed plate termination may not support the targeted breakdown voltage due to the lower epitaxial resistivity than the conventional devices. Furthermore, early breakdown can often occur at the trench bottom corners that limit the applications of the device.

Therefore, a need still exists in the art of power semiconductor device design and manufacture to provide new manufacturing method and device configuration in forming the semiconductor power devices such that the above discussed problems and limitations can be resolved.

SUMMARY OF THE PRESENT INVENTION

It is therefore an aspect of the present invention to provide a new and improved semiconductor power device by forming a thick oxide layer at the bottom portions of a gate with a substrate provided with double epitaxial layer structure. The double epitaxial layer has a dopant concentration to provide an epitaxial resistivity that is higher near the trench bottom corners for preventing an early breakdown and a low epitaxial resistivity above the trench bottom to provide a reduced device resistance such that the difficulties and limitations of the above-discussed prior art may be overcome.

Another aspect of this invention is to form an improved MOSFET device with thick either split gate or gate padded with thicker oxide layer at the bottom of the trenched gate such that the gate to drain capacitance can be reduced. The performance of the device is further improved with reduced Rds by reducing the resistivity of the epitaxial layer with double epitaxial layer with an upper epitaxial layer having a lower resistivity. The double epitaxial layer has a lower epitaxial layer with a higher resistivity near the trench bottom corner such that the breakdown voltage is improved.

Another aspect of this invention is to form an improved MOSFET device with double epitaxial layer structure with a lower epitaxial layer near the trench corners to have a resistivity for preventing degraded breakdown voltages. A breakdown voltage of up to 115 volts can be achieved according to a simulation analysis. A two-layer structure of N-epitaxial layers with dopant concentration of 2E16 with a thickness of 6 µm and 8E15 with a thickness of 4 µm can achieve a reduced Rdson of 67.3 mohm-mm$^2$ that is less than the silicon theoretical limit of 82 mohm-mm$^2$.

Briefly in a preferred embodiment, this invention discloses a trenched semiconductor power device comprising a plurality of trenched gates surrounded by source regions near a top surface of a semiconductor substrate encompassed in body regions. The trenched semiconductor power device further includes a first epitaxial layer with resistivity N1 above N+ substrate and beyond the trench bottom and a second epitaxial layer with resistivity N2 above the first epitaxial layer wherein the resistivity N1 of the first epitaxial layer is greater than the resistivity N2 of the second epitaxial layer represented by a functional relationship of N1>N2. In an exemplary embodiment, each of the trenched gates include an upper gate portion and lower gate portion formed with two different polysilicon deposition processes wherein the lower gate portion is surrounded with a lower gate insulation layer having a greater thickness than an upper gate insulation layer surrounding the upper gate portion. In another exemplary embodiment, the lower gate insulation layer is formed before the upper gate insulation layer as two different insulation layer forming processes. In another exemplary embodiment, the trenched semiconductor power device is a N-channel MOSFET device with p-type body regions and N-type source regions wherein a deeper P+ dopant region is formed in the P-type body regions below the N-type source region and a P++ type dopant region is disposed between the N-type source regions near a top surface of the semiconductor substrate for providing an ohmic contact. In another exemplary embodiment, the trenched semiconductor power device further includes an insulation layer covering a top surface of the semiconductor having a plurality of openings in an area between the source regions for depositing a metal layer and patterning into a source metal through the openings. In another exemplary embodiment, the trenched semiconductor power device further a source contact dopant regions near the top surface of the semiconductor substrate between the source regions for enhancing a ohmic contact to the source metal. In another exemplary embodiment, the trenched semiconductor power device further a deep dopant regions in the body regions below the source regions for preventing a parasitic bipolar transistor turning on for increasing a device ruggedness of the semiconductor power device. In another exemplary embodiment, each of the trenched gates include an upper gate portion and lower gate portion formed with two different polysilicon deposition processes wherein the lower gate portion is surrounded with a lower gate insulation layer having a greater thickness than an upper gate insulation layer surrounding the upper gate portion. The trenched semiconductor substrate further includes an insulation layer disposed between the upper gate portion and the lower gate portion as an inter-gate insulation layer.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1A:
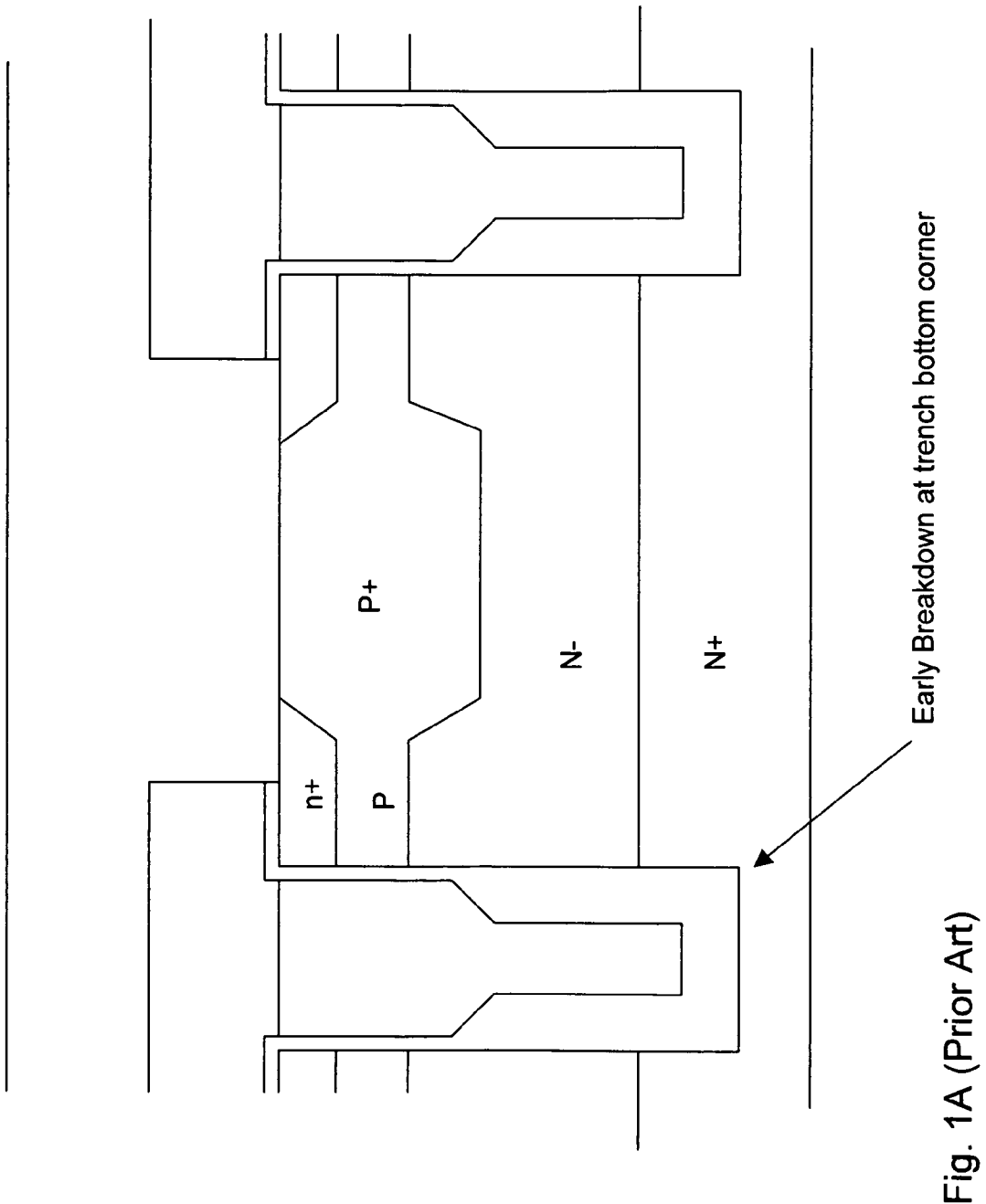
FIGS. 1A to 1C are cross sectional views of different conventional trenched MOSFET power devices with reduced gate-to-drain capacitance and reduced epitaxial resistivity.
Figure 1B:
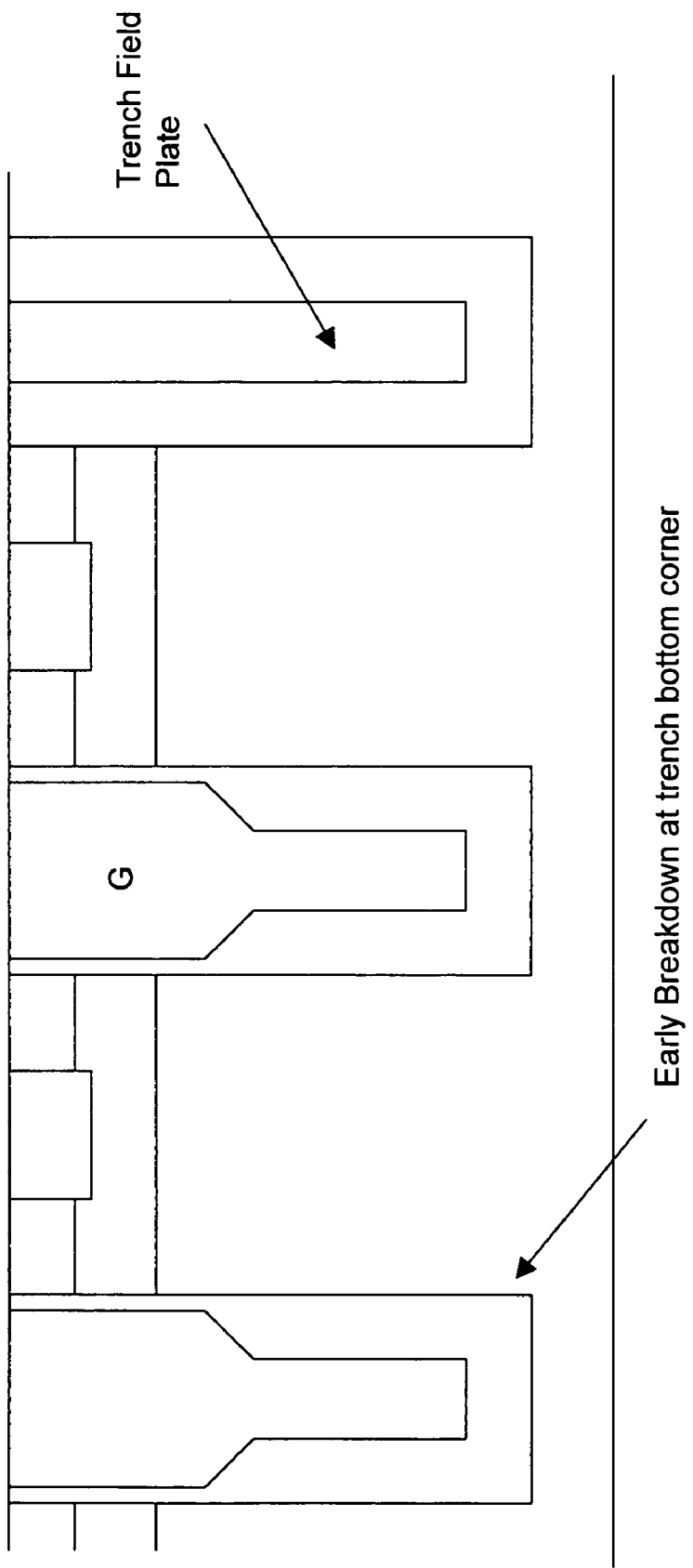
Figure 1C:
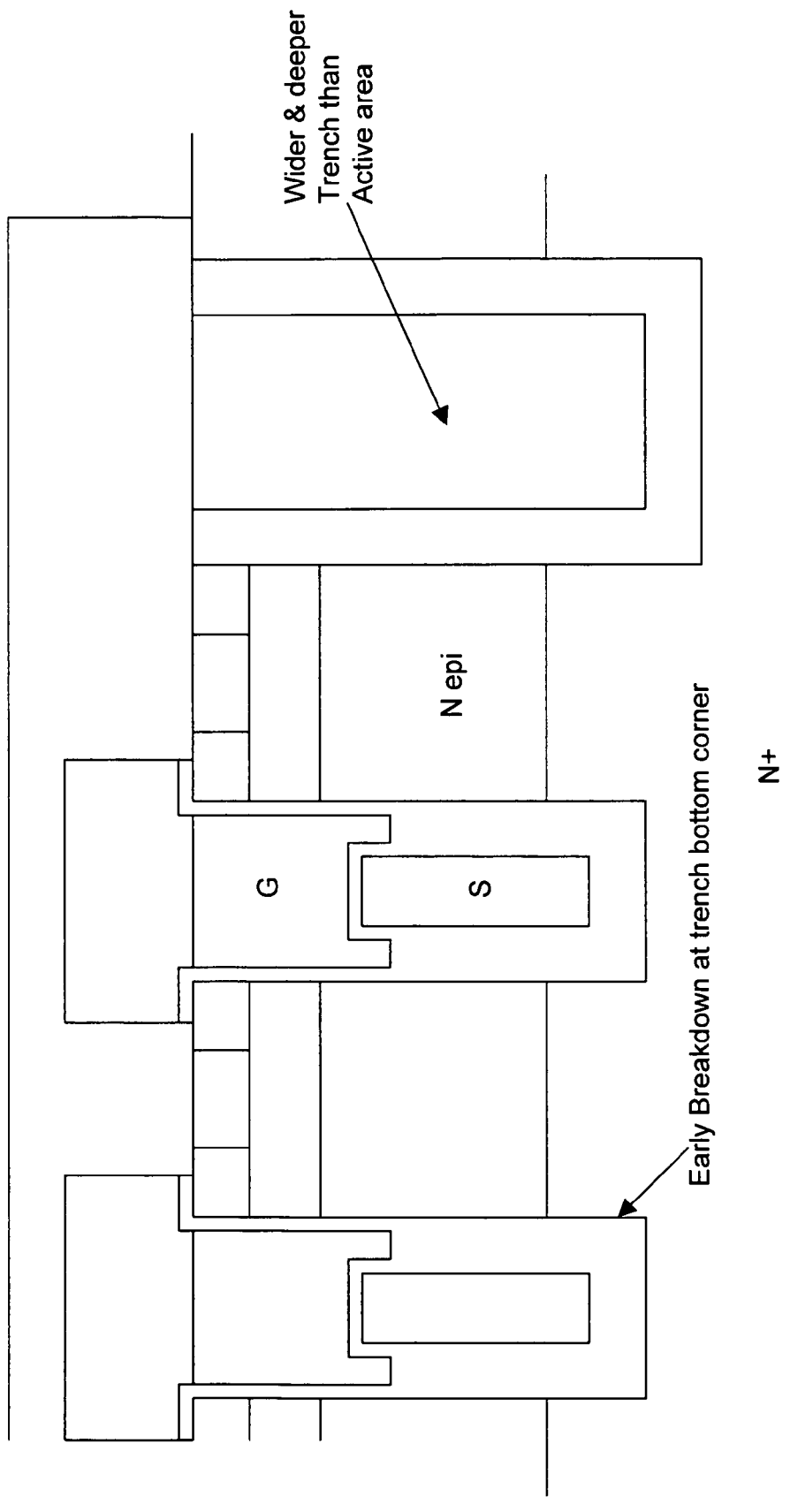
Figure 2:
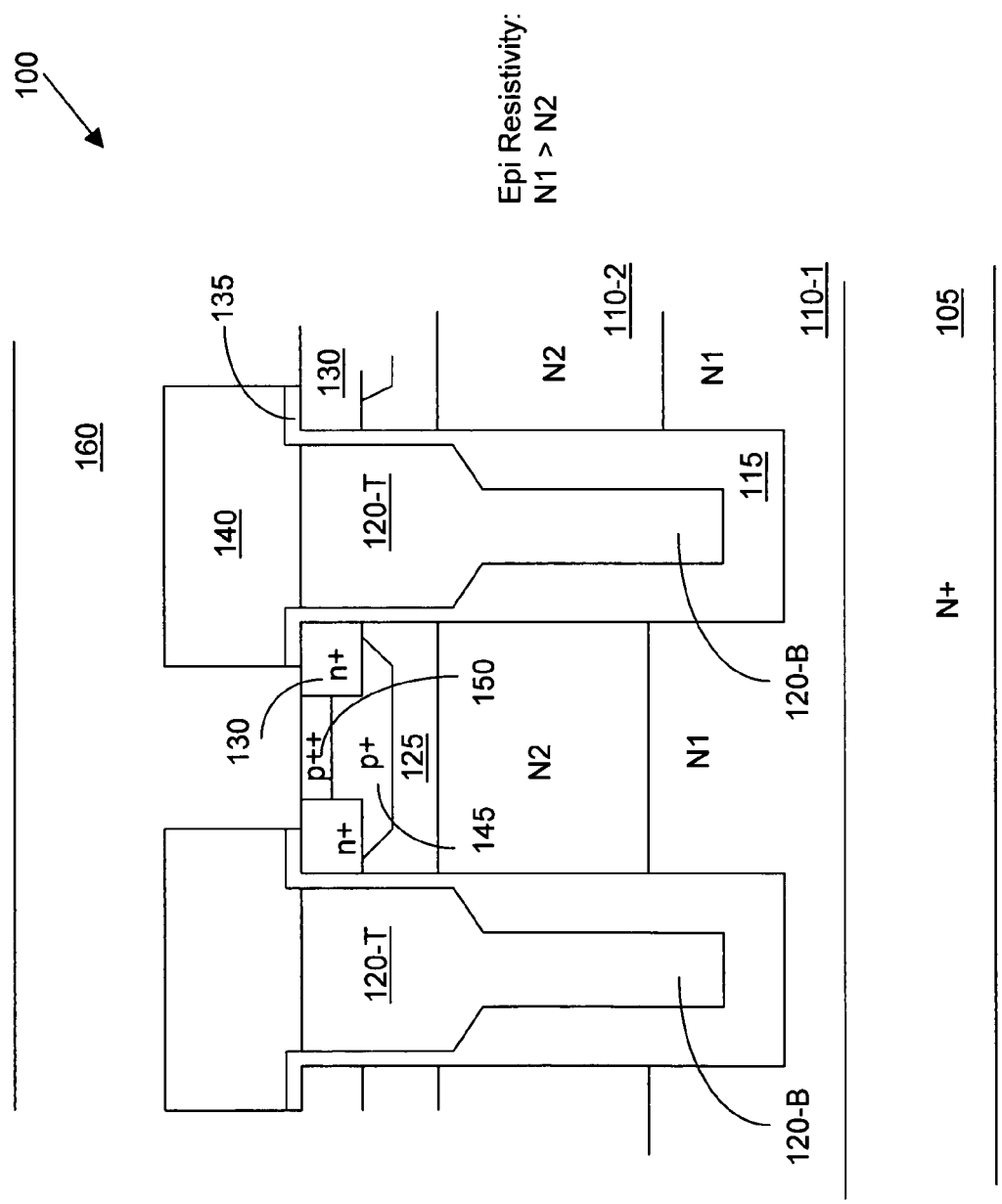
FIGS. 2 to 3 are four alternate embodiments of the present invention of a MOSFET device implemented with a double epitaxial drift region with a lower epitaxial layer near the trench corners to have a resistivity for preventing degraded breakdown voltages.

Referring to FIG. 2 for a side cross sectional view of a MOSFET device 100 formed on a N+ substrate 105 supporting a first and second N-epitaxial layer 110-1 and 110-2 having a N-dopant concentration to provide resistivity represented by N1 and N2 respectively. The resistivity N1 is greater than resistivity N2, i.e., N1>N2. The MOSFET device further includes a plurality of trenched polysilicon gates 120. Each of these trenched gates includes a top gate portion 120-T and a bottom portion 120-B wherein the top portion 120-T and the bottom portion 120-B are formed with single polysilicon deposition processes as will be further described below. At the bottom portion of the trenched gate, a gate oxide layer 115 with a greater thickness surrounds and insulates the gate 120-B. In the top portion of the gates 120-T, a gate oxide layer 135 has a normal and thinner layer thickness surrounds and insulates the top portion of the gate 120-T. The bottom thick gate oxide 115 is formed first and the top thinner gate oxide 135 is formed later in two different processing steps.

A plurality of P-body regions 125 surround the trenched gates 120 that include the top and bottom gate portions 120-T and 120-B respectively. The body regions 125 further encompassed source regions 130 formed near the top surface of the second epitaxial layer 110-2 surrounding the trenched gates 120. The areas on the top surface between adjacent source regions 130 are implemented as source contact surface. For the purpose of enhancing device ruggedness or avalanche capability to avoid parasitic N+PN+ bipolar turning on, a deeper P+ dopant region 145 is formed in the P-body region 125 below the source regions 130 and a P++ dopant region 150 is formed between the source region 130 near the top surface for ohmic contact to front metal. An oxide insulation layer 140 covering the top surface with contact openings right above the contact enhancing dopant regions 150 are opened through the insulation layer to allow for the metal contact layer 160 to physically contact the source/body regions through the contact enhancing regions 150. The contact metal layer is further patterned to provide a gate pad (not specifically shown) to contact the gate. The deeper P+ regions 145 are formed for the purpose of enhancing device ruggedness or avalanche capability to avoid inadvertently turning on the parasitic N+PN+ bipolar transistor.

The MOSFET device has special dual epitaxial structure that includes a first epitaxial layer and a second epitaxial layer 110-1 and 110-2 to increase the breakdown voltage and lower the Rds. The resistivity of the epitaxial layer of the second epitaxial layer 110-2 above the trench bottom is lower that the epitaxial layer 110-1 below the trench bottom. The gate oxide 115 on the bottom portion of the trenched gate is thicker than the gate oxide 135 on the top portion of the trench gate, and these two gate oxide layers 115 and 135 are formed with two separate gate oxide formation processes. The polysilicon gate 120 also includes two segments, i.e., a top segment 120-T and bottom segment 120-B and these two segment are connected together but formed in two different gate formation processes.

Figure 3:
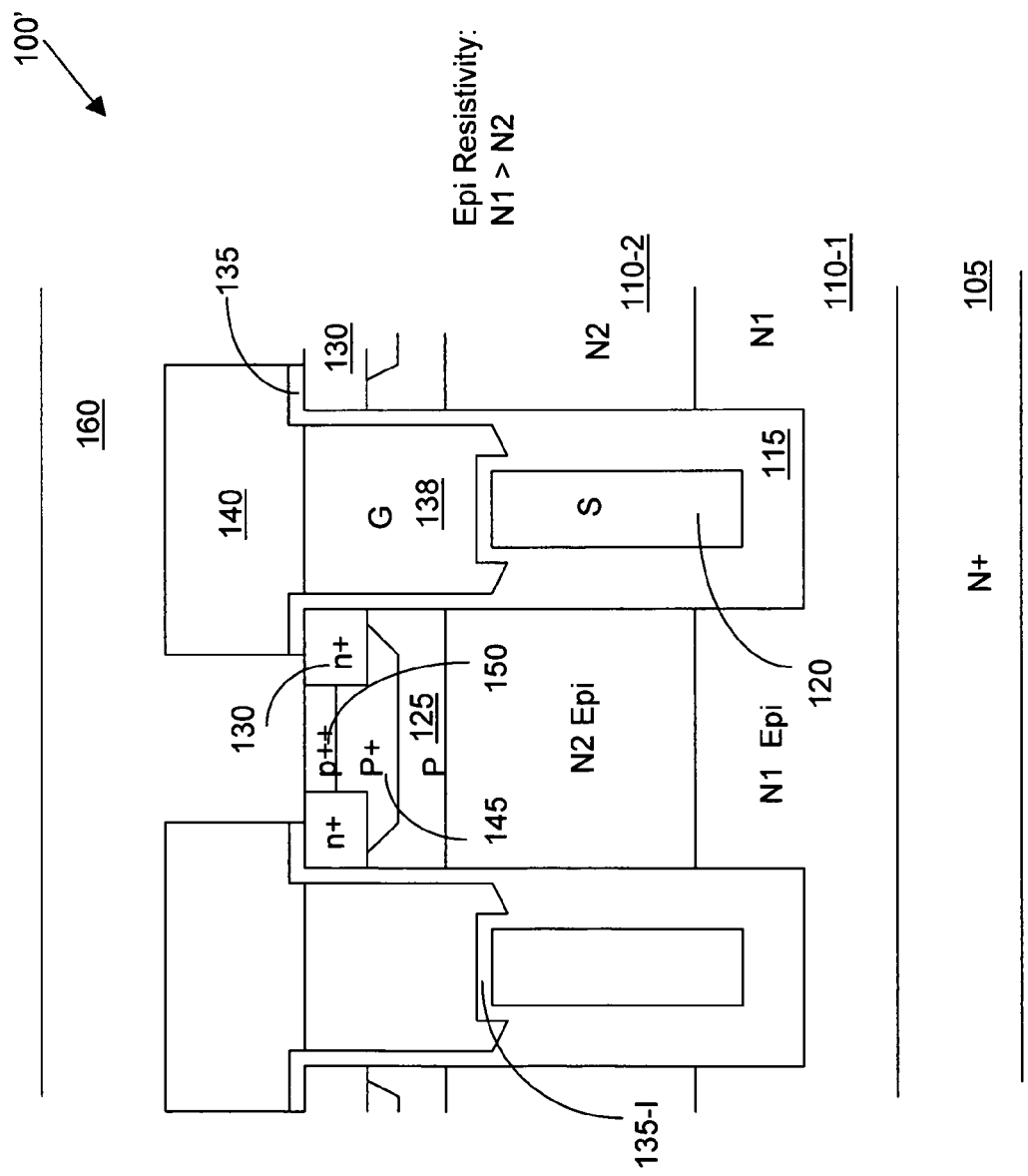

FIG. 3 shows a side cross sectional view of an alternate MOSFET device 100' with similar device configuration as the MOSFET 100 of FIG. 2. The only difference is that the trenched gates of the MOSFET 100' are formed as split gates. Each of the trenched gates includes a top gate segment 138 and bottom gate segment 120 insulated by an inter-segment insulation layer 135-I that is formed together with the top gate oxide layer 135. The top and bottom gate segments are separated. Furthermore, the gate oxide 115 on the bottom portion of the trenched gate is thicker than the gate oxide 135 on the top portion of the trench gate, and these two gate oxide layers 115 and 135 are formed with two separate gate oxide formation processes. As will be further described below, the inter-segment insulation layer 135-I is formed together with the top gate oxide layer 135. Again, the device has higher breakdown voltage and lower Rds by implementing a dual epitaxial structure that includes a bottom epitaxial layer 110-1 and a top epitaxial layer 110-2. The dual epitaxial layers 110-1 and 110-2 have N-dopant concentrations to provide resistivity represented of N1 and N2 respectively where N1>N2.

Figure 4A:
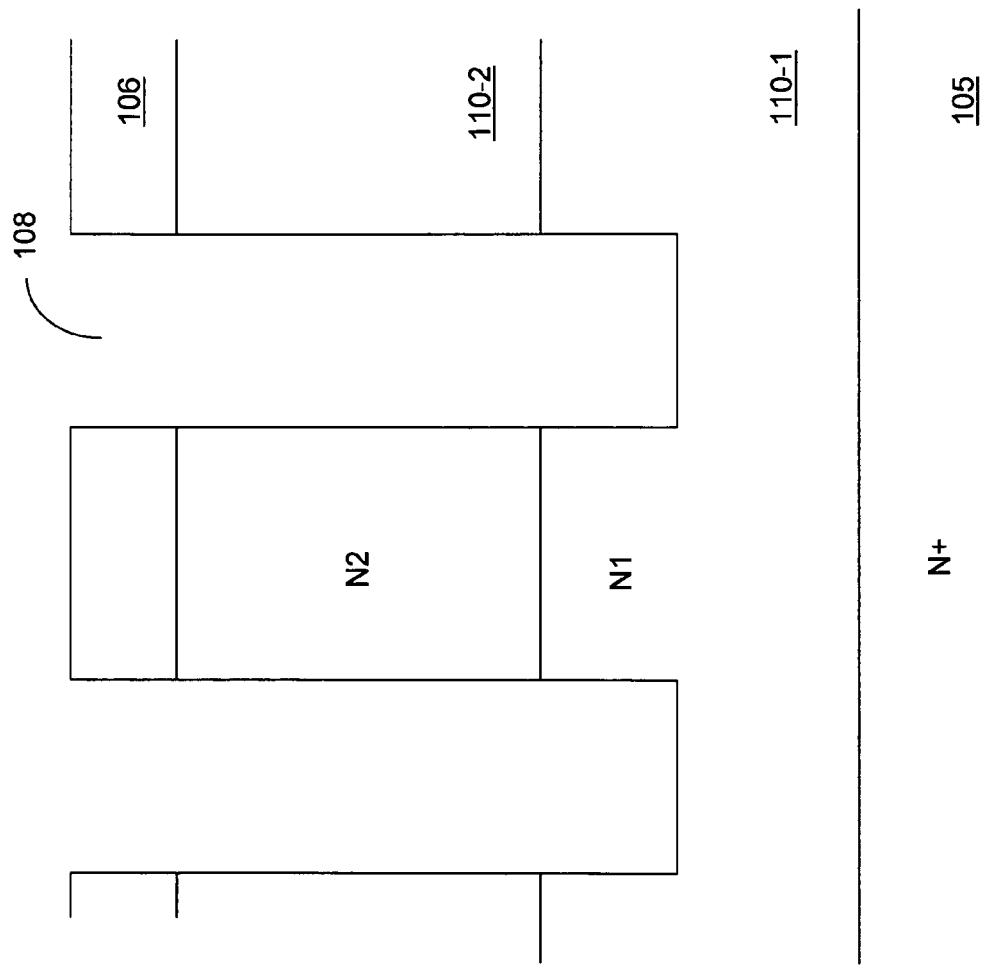
FIGS. 4A to 4G are a serial cross sectional views for describing the manufacturing processes to provide a trenched MOSFET device with of the present invention with a first and second epitaxial layer and split gate with a thick oxide layer surrounding the bottom gate segment.
Figure 4B:
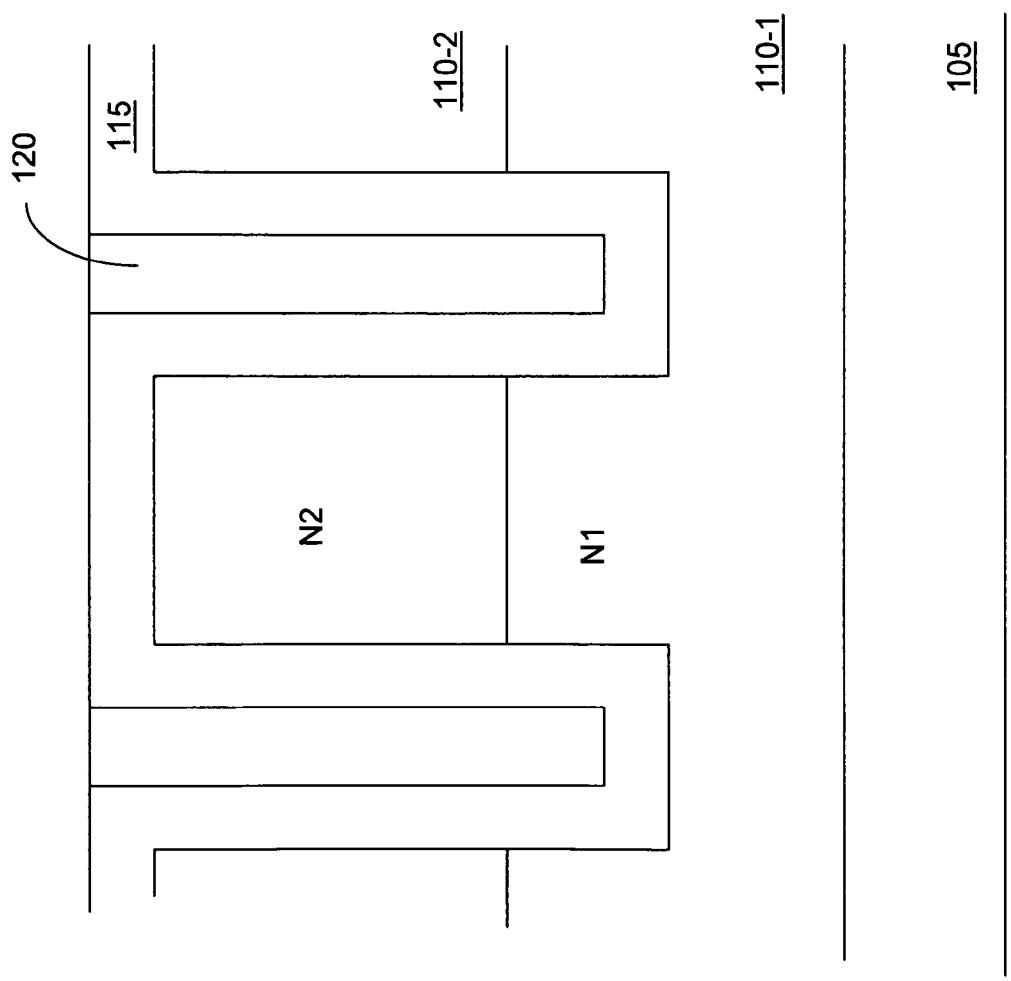

Referring to FIGS. 4A to 4G for a series of cross sectional views to illustrate the processing steps for manufacturing a MOSFET device as shown in FIGS. 2 and 3. In FIG. 4A, a trench mask 106 is applied to open a plurality of trenches 108 in a substrate 105 supporting a first and second epitaxial layers 110-1 and 110-2. The processes of opening the trenches 108 includes a dry oxide etch and a dry silicon etch. In FIG. 4B, the mask 106 and the oxide layer is removed followed by a thermal oxide growth or an oxide deposition to form a thick oxide layer 115 surrounding the trench bottom and sidewalls. Then a doped polysilicon 120 is deposited into the trenches followed by etching back the polysilicon from above the top surface.

Figure 4C:
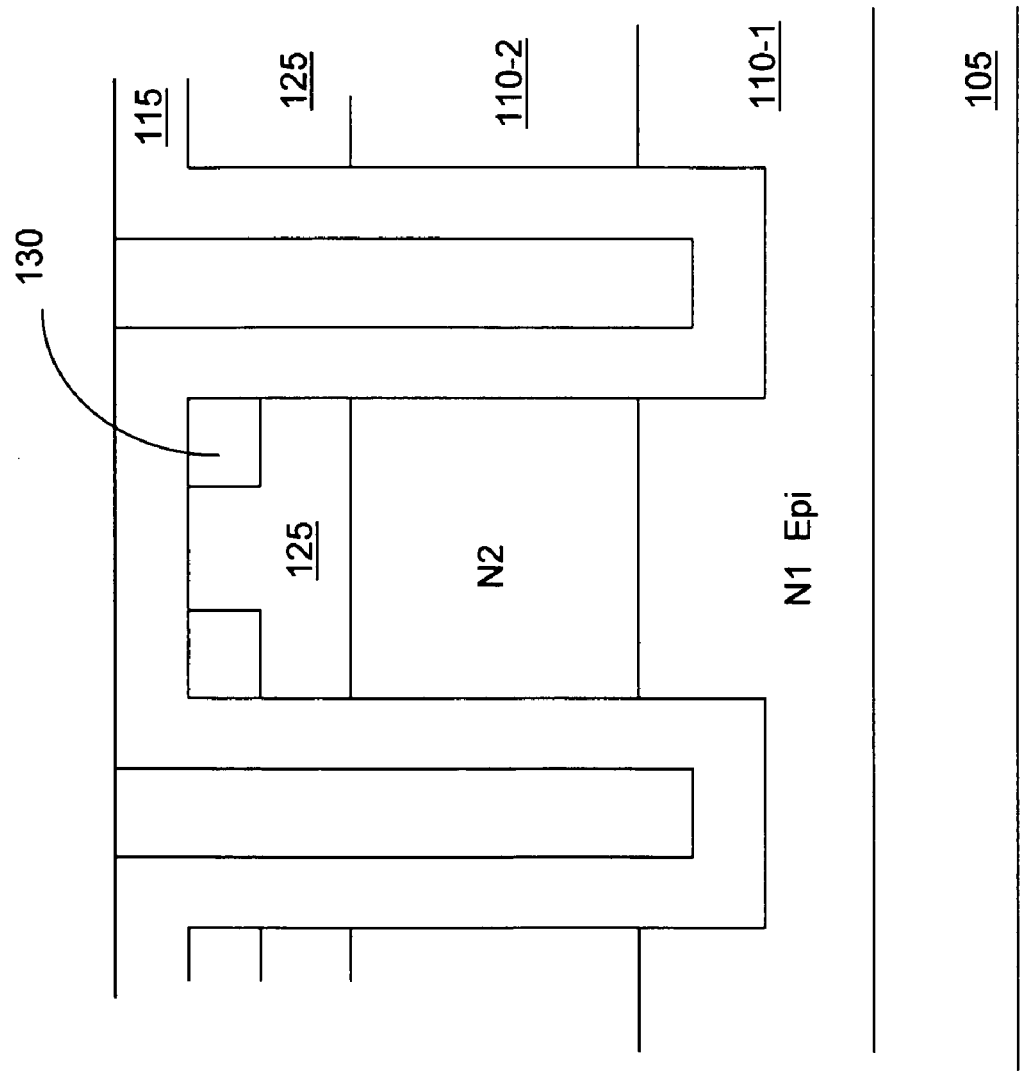
Figure 4D:
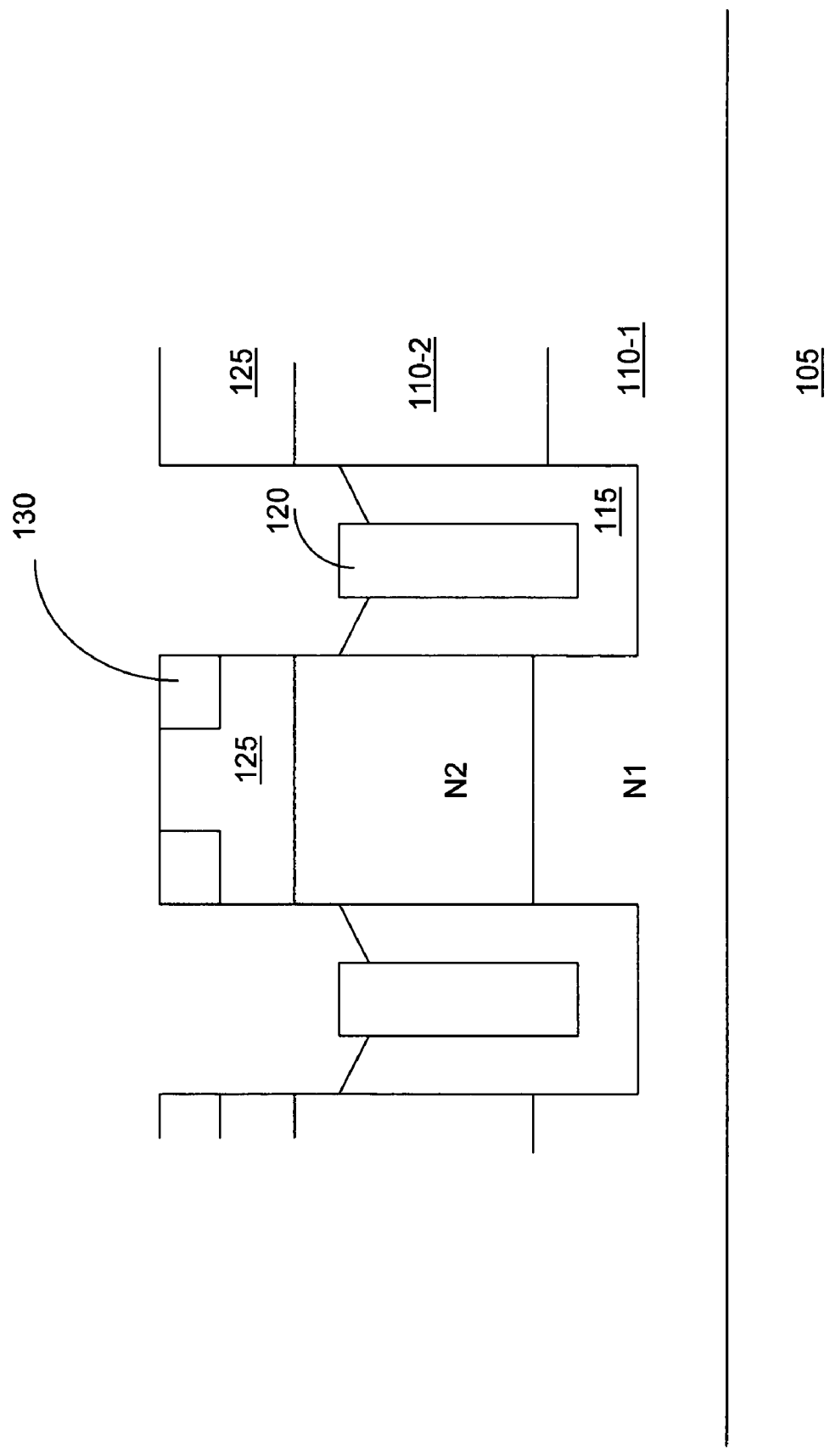
Figure 4E:
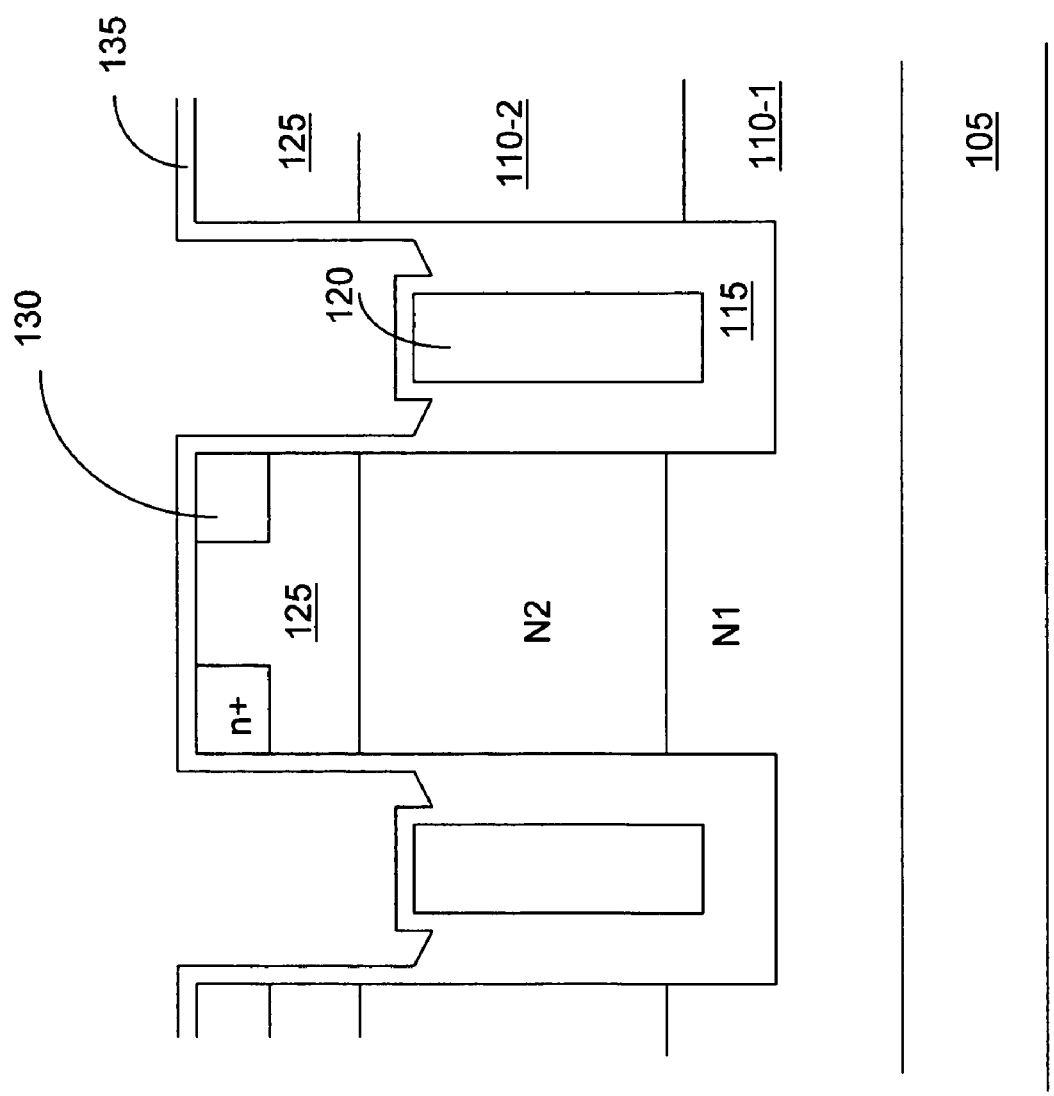
Figure 4F:
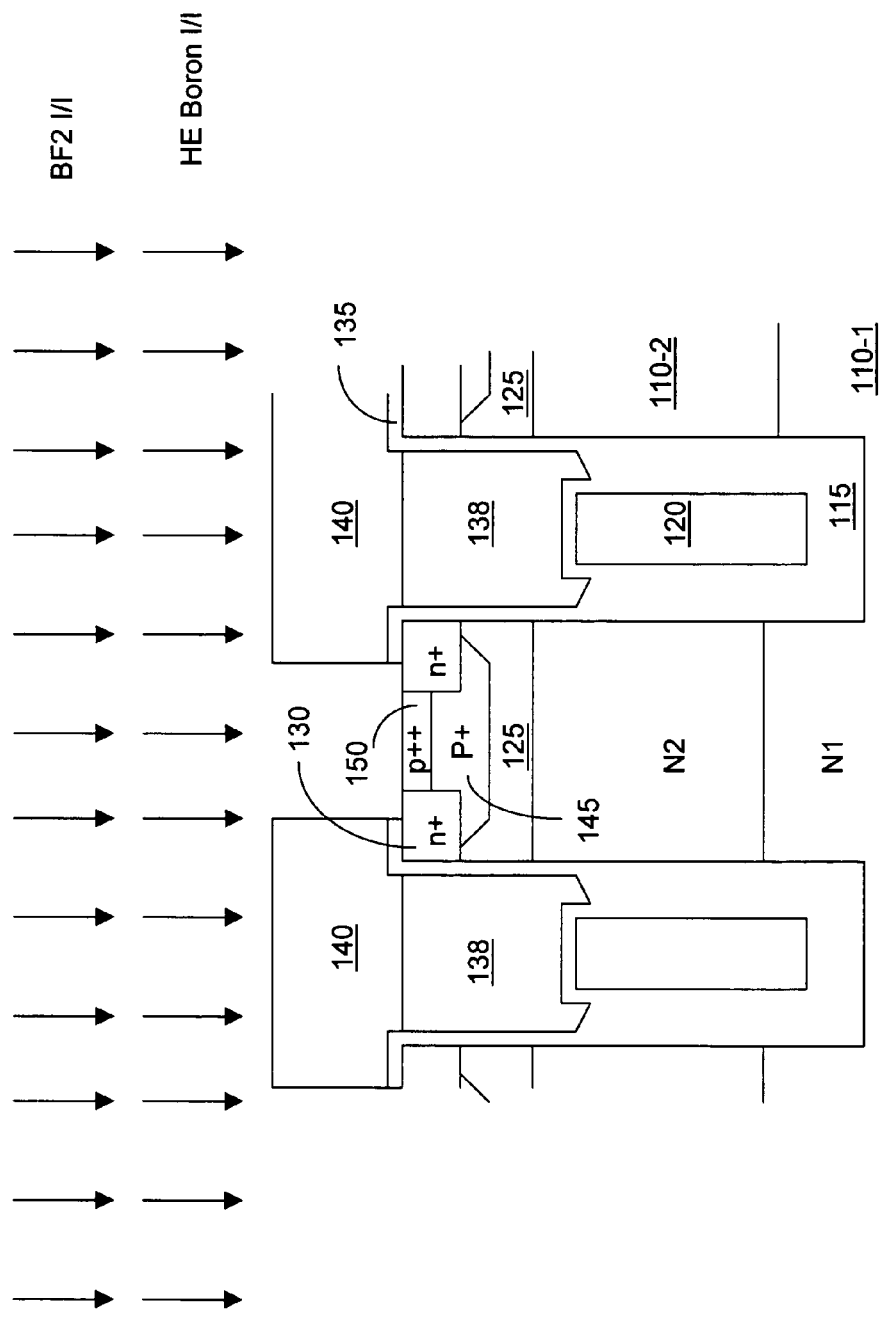
Figure 4G:
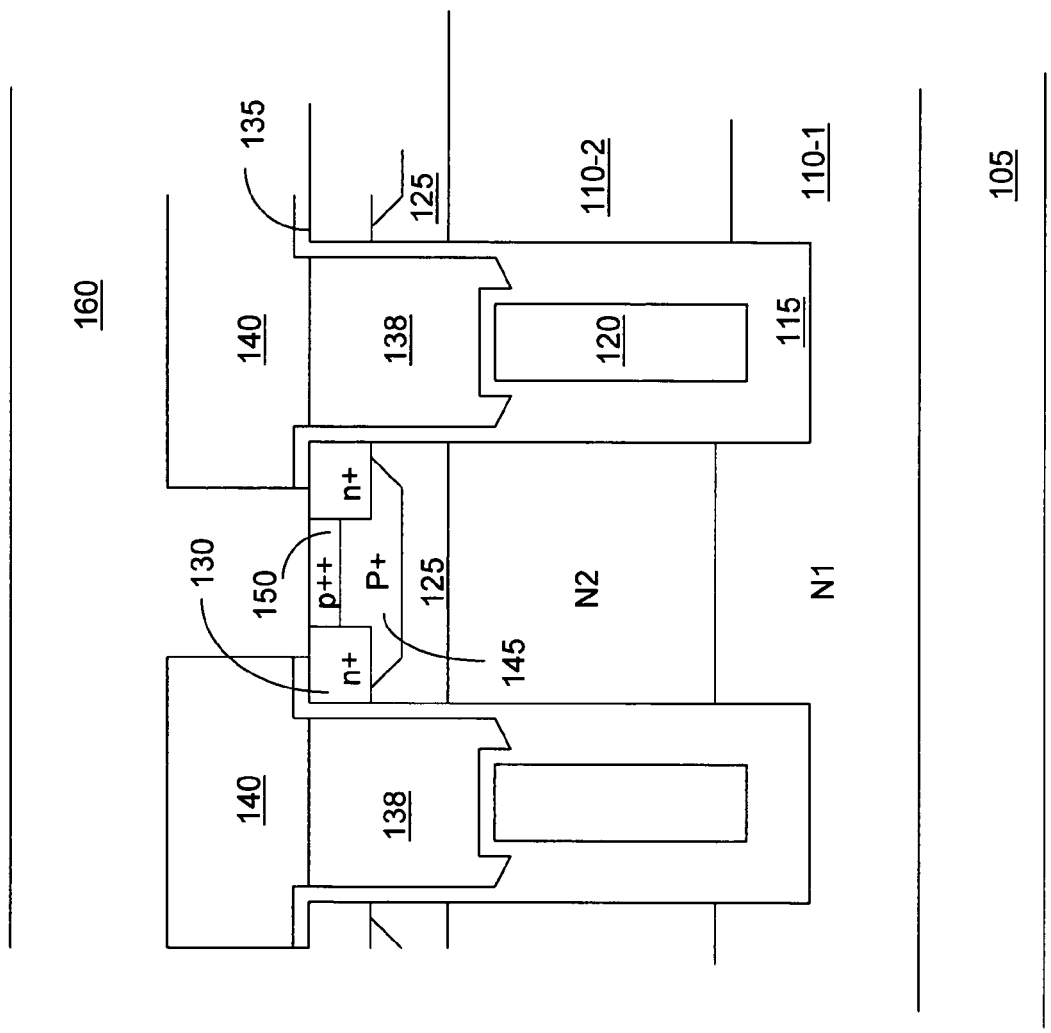

In FIG. 4C, a P-well mask (not shown) is applied to carry out a P-well ion implant and body diffusion to form the P-body 125. Then a source mask (not shown) is applied to carry out a source ion implant followed by source region diffusion to form the source regions 130 inside the P-body regions 125. In FIG. 4D, a polysilicon etch back is carried out to etch back the polysilicon 120 for the top of the trenches followed by applying an oxide etch to etch the oxide layer 115 from the top portion of the trenches. In FIG. 4E, a gate oxide layer growth is carried out to grow a gate oxide layer 135 cover the top surfaces. In FIG. 4F, a second doped polysilicon layer is deposited and etch back served as upper gate 138. An oxide deposition is then performed to deposit an oxide layer 140 covering the entire top surface. A contact mask (not shown) is applied to etch the contact openings by applying a dry oxide etch. Then a high-energy boron ion implant is first performed through the contact opening to form the deeper P+ doped regions 145 in the body regions 125. A low energy high dose BF2 ion implant is carried out to form a shallow contact doped-regions 150 near the top surface in the body region between the source regions 130. In FIG. 4G, a metal layer 160 is deposited followed by a metal layer patterning process to form the source-body metal and gate pad (not shown) to complete the manufacturing processes of the MOSFET device.

According to above drawings and descriptions, this invention further discloses a method for manufacturing a trenched semiconductor power device includes a plurality of trenched gates surrounded by source regions near a top surface of a semiconductor substrate encompassed in body regions. The method includes a step of opening a plurality of trenches each having a trench bottom surface in the semiconductor substrate wherein the semiconductor substrate having a first epitaxial layer above the N+ substrate extending beyond the trench bottom surface and a second epitaxial layer above the first epitaxial layer wherein a resistivity N1 of the first epitaxial layer is greater than a resistivity N2 of the second epitaxial layer represented by a functional relationship of N1>N2. In an exemplary embodiment, the method further includes a step of forming a lower gate insulation layer on a lower part of the trenches followed by forming a lower gate portion surrounded and insulated by the lower gate insulation layer. The method further includes another step of forming an upper gate insulation layer thinner than the lower gate insulation layer followed by forming an upper gate portion surrounded and insulated by the upper gate insulation layer. In another exemplary embodiment, the method further includes a step of forming an inter-gate insulation layer on top of the lower gate portion before the step of forming the upper gate portion for insulating the lower gate portion from the upper gate portion. In another exemplary embodiment, the method further includes a step of forming the trenched semiconductor power device as a N-channel MOSFET device by forming p-type body regions and N-type source regions. The method further includes a step of forming a deeper P+ dopant region in the P-type body regions below the N-type source region and forming a P++ type dopant region is between the N-type source regions near a top surface of the semiconductor substrate for providing an ohmic contact. In another exemplary embodiment, the method further includes a step of forming an insulation layer over a top surface of the semiconductor and opening a plurality of contact openings through the insulation layer in an area between the source regions for depositing a metal layer and patterning into a source metal through the openings. In another exemplary embodiment, the method further includes a step of implanting source contact dopant regions near the top surface of the semiconductor substrate through the plurality of contact openings between the source regions for enhancing a ohmic contact to the source metal. In another exemplary embodiment, the method further includes a step of implanting through the plurality of contact openings for forming deep dopant regions in the body regions below the source regions for preventing a parasitic bipolar transistor turning on for increasing a device ruggedness of the semiconductor power device.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

I claim:

1. A trenched semiconductor power device comprising a plurality of trenched gates surrounded by source regions near a top surface of a semiconductor substrate encompassed in body regions, said trenched semiconductor power device further comprising:
    a first epitaxial layer of a first conductivity type disposed above a heavily doped substrate and extends above a bottom surface of the trenched gates and a second epitaxial layer of the first conductivity type disposed above said first epitaxial layer wherein a resistivity N1 of said first epitaxial layer is greater than a resistivity N2 of said second epitaxial layer represented by a functional relationship of N1>N2;
    each of said trenched gates includes an upper gate portion and lower gate portion wherein said lower gate portion is surrounded with a lower gate insulation layer having a greater thickness than an upper gate insulation layer surrounding said upper gate portion; and
    said body regions of a second conductivity type interfacing with said second epitaxial layer constituting P/N junctions wherein said P/N junctions disposed above said lower gate portion surrounded by said lower insulation layer having a greater thickness formed on sidewalls of said trenched gates and said lower gate insulation layer interfaces with said upper gate insulation layer at a vertical level surrounded by said second epitaxial layer having the lower resistivity N2 but below each of said P/N junctions.

2. The trenched semiconductor power device of claim 1 wherein:
    said lower gate insulation layer is formed before said upper gate insulation layer as two different insulation layers by applying two different layer forming processes.

3. The trenched semiconductor power device of claim 1 wherein:
    said trenched semiconductor power device is a N-channel MOSFET device with p-type body regions and N-type source regions wherein deeper a P+ doped region is disposed in each of said P-type body regions below said N-type source region and a P++ type doped region is disposed between the N-type source regions in each of said body regions near a top surface of said second epitaxial layer for providing an ohmic contact to said p-type body regions.

4. The trenched semiconductor power device of claim 1 further comprising:
    an insulation layer covering a top surface of said semiconductor having a plurality of openings in an area between said source regions for depositing a metal layer and patterning into a source metal for contacting said source and body regions through said openings.

5. The trenched semiconductor power device of claim 4 further comprising:
    a shallow contact doped region of a same conductivity type as said body regions and higher doping concentration than said body regions disposed near said top surface in each of said body regions for enhancing an ohmic contact of said body regions and source regions to said source metal.

6. The trenched semiconductor power device of claim 5 further comprising:
a deep doped region of a same conductivity type as said body regions and having a higher doping concentration than said body regions is disposed in each of said body regions below said source regions and said shallow contact doped region for preventing a parasitic bipolar transistor turning on for increasing a device ruggedness of said semiconductor power device.

7. The trenched semiconductor power device of claim 1 wherein:
said trenched semiconductor power device is a N-channel MOSFET device having breakdown voltage 115V with said first epitaxial layer and second epitaxial layer having doping concentration approximately $8E15\ cm^{-3}$ and $2E16\ cm^{-3}$, respectively.

8. The trenched semiconductor power device of claim 1 wherein:
said trenched semiconductor power device is a P-channel MOSFET device having breakdown voltage 115V with said first epitaxial layer and second epitaxial layer having doping concentration approximately $8E15\ cm^{-3}$ and $2E16\ cm^{-3}$, respectively.

9. A trenched semiconductor power device comprising a plurality of trenched gates surrounded by source regions near a top surface of a semiconductor substrate encompassed in body regions, said trenched semiconductor power device further comprising:
a first epitaxial layer of a first conductivity type disposed above a heavily doped substrate and extends above a bottom surface of the trenched gates and a second epitaxial layer of the first conductivity type disposed above said first epitaxial layer wherein a resistivity N1 of said first epitaxial layer is greater than a resistivity N2 of said second epitaxial layer represented by a functional relationship of N1>N2;
each of said trenched gates includes an upper gate portion and lower gate portion formed with two different polysilicon deposition processes wherein said lower gate portion is electrically connected to a source metal and surrounded with a lower gate insulation layer having a greater thickness than an upper gate insulation layer surrounding said upper gate portion electrically connected to a gate metal;
an insulation layer disposed between said upper gate portion and said lower gate portion as an inter-gate insulation layer; and
said body regions of a second conductivity type interfacing with said second epitaxial layer constituting P/N junctions wherein said P/N junctions disposed above said lower gate portion surrounded by said lower insulation layer having a greater thickness formed on sidewalls of said trenched gates and said lower gate insulation layer interfaces with said upper gate insulation layer at a vertical level surrounded by said second epitaxial layer having the lower resistivity N2 but below each of said P/N junctions.

10. The trenched semiconductor power device of claim 9 wherein:
said lower gate insulation layer is formed before said upper gate insulation layer as two different insulation layers by applying two different layer forming processes.

11. The trenched semiconductor power device of claim 9 wherein:
said trenched semiconductor power device is a N-channel MOSFET device with p-type body regions and N-type source regions wherein deeper a P+ doped region is disposed in each of said P-type body regions below said N-type source region and a P++ type doped region is disposed between the N-type source regions in each of said body regions near a top surface of said second epitaxial layer for providing an ohmic contact to said p-type body regions.

12. The trenched semiconductor power device of claim 9 further comprising:
an insulation layer covering a top surface of said semiconductor having a plurality of openings in an area between said source regions for depositing a metal layer and patterning into a source metal for contacting said source and body regions through said openings.

13. The trenched semiconductor power device of claim 9 further comprising:
a shallow contact doped region of a same conductivity type as said body regions and higher doping concentration than said body regions disposed near said top surface in each of said body regions for enhancing an ohmic contact of said body regions and source regions to said source metal.

14. The trenched semiconductor power device of claim 13 further comprising:
a deep doped region of a same conductivity type as said body regions and having a higher doping concentration than said body regions is disposed in each of said body regions below said source regions and said shallow contact doped region for preventing a parasitic bipolar transistor turning on for increasing a device ruggedness of said semiconductor power device.

15. The trenched semiconductor power device of claim 9 wherein:
said trenched semiconductor power device is a N-channel MOSFET device having breakdown voltage 115V with said first epitaxial layer and second epitaxial layer having doping concentration approximately $8E15\ cm^{-3}$ and $2E16\ cm^{-3}$, respectively.

16. The trenched semiconductor power device of claim 9 wherein:
said trenched semiconductor power device is a P-channel MOSFET device having breakdown voltage 115V with said first epitaxial layer and second epitaxial layer having doping concentration approximately $8E15\ cm^{-3}$ and $2E16\ cm^{-3}$, respectively.

17. A method for manufacturing a trenched semiconductor power device comprising plurality of trenched gates surrounded by source regions near a top surface of a semiconductor substrate encompassed in body regions, said method comprising:
opening a plurality of trenches in said semiconductor substrate having a first epitaxial layer of a first conductivity and a second epitaxial layer of the first conductivity type above said first epitaxial layer wherein a resistivity N1 of said first epitaxial layer is greater than a resistivity N2 of said second epitaxial layer represented by a functional relationship of N1>N2; and
forming a lower gate insulation layer on a lower part of said trenches followed by forming a lower gate portion surrounded and insulated by said lower gate insulation layer below a P/N interfaces between the second epitaxial layer of the first conductivity type and the body regions of a second conductivity type wherein said lower gate insulation layer interfaces with said upper gate insulation layer at a vertical level surrounded by said second epitaxial layer having the lower resistivity N2 but below each of said P/N junctions.

18. The method of claim 17 further comprising:

forming an upper gate insulation layer covering upper sidewalls of said trenches having a thickness thinner than said lower gate insulation layer followed by forming an upper gate portion surrounded and insulated by said upper gate insulation layer.

19. The method of claim 18 further comprising:

forming an inter-gate insulation layer on top of and insulating said lower gate portion before the step of forming the upper gate portion for insulating said lower gate portion from said upper gate portion.

20. The method of claim 18 further comprising:

forming said trenched semiconductor power device as a N-channel MOSFET device by forming p-type body regions and N-type source regions; and forming a deeper P+ doped region in each of said P-type body regions below said N-type source region and forming a P++ type doped region between the N-type source regions near a top surface of said semiconductor substrate in each of said P-type body regions for providing an ohmic contact.

21. The method of claim 20 further comprising:

implanting a shallow contact doped region near said top surface of said semiconductor substrate through said plurality of source mask openings in each of said body regions for enhancing an ohmic contact of said source and body regions to said source metal.

22. The method of claim 20 further comprising:

implanting through said plurality of contact openings for forming a shallow P++ doped region for ohmic contact, and a deep P+ doped region in each of said body regions below said source regions for preventing a parasitic bipolar transistor turning on for increasing a device ruggedness of said of N-Channel MOSFET device.

23. The method of claim 18 further comprising:

forming an insulation layer over a top surface of said semiconductor and opening a plurality of contact openings through said insulation layer in an area between said source regions for depositing a metal layer and patterning into a source metal for contacting said source and body regions through said openings.

* * * * *